United States Patent [19]
Palumbo

[11] Patent Number: 5,991,611
[45] Date of Patent: Nov. 23, 1999

[54] VOLUME CONTROL DEVICE FOR RECEIVER OF BLOCK CODED SPEECH SIGNALS

[75] Inventor: Nicolas Palumbo, Paris, France

[73] Assignee: Alcatel Mobile Phones, Paris, France

[21] Appl. No.: 08/698,030

[22] Filed: Aug. 15, 1996

[30] Foreign Application Priority Data

Aug. 16, 1995 [FR] France .................................. 95 09839

[51] Int. Cl.⁶ ....................................................... H04B 1/10
[52] U.S. Cl. ........................ 455/219; 714/747; 455/35.1
[58] Field of Search ........................ 340/825.5; 370/336, 370/342, 347, 435, 510, 522; 714/747; 375/200, 259, 351; 380/34; 395/228; 704/221, 228, 229; 379/388, 389, 390; 455/200.1, 218–22, 222, 223, 296, 234.1, 254

[56] References Cited

U.S. PATENT DOCUMENTS

| | | | |
|---|---|---|---|
| 4,593,392 | 6/1986 | Kuoyama | 371/31 |
| 4,881,123 | 11/1989 | Chapple | 381/104 |
| 5,146,610 | 9/1992 | Longshore et al. | 455/35.1 |
| 5,148,431 | 9/1992 | Hayashi | 371/5.1 |
| 5,239,557 | 8/1993 | Dent | 370/342 |
| 5,271,011 | 12/1993 | McMullan, Jr. et al. | 371/53 |
| 5,349,701 | 9/1994 | Lobel | 455/222 |
| 5,414,711 | 5/1995 | Okada et al. | |
| 5,414,796 | 5/1995 | Jacobs et al. | 704/221 |
| 5,416,779 | 5/1995 | Barnes et al. | |
| 5,537,509 | 7/1996 | Swaminathan et al. | 704/228 |
| 5,553,192 | 9/1996 | Hayata | 395/237 |
| 5,559,833 | 9/1996 | Hayet | 375/259 |
| 5,563,952 | 10/1996 | Mercer | 381/56 |
| 5,594,799 | 1/1997 | Herrmann | 381/13 |
| 5,630,016 | 5/1997 | Swaminathan et al. | 395/2.37 |
| 5,657,420 | 8/1997 | Jacobs et al. | 704/223 |
| 5,771,440 | 6/1998 | Sukhu et al. | 455/63 |
| 5,815,507 | 9/1998 | Vinggaard et al. | 371/5.1 |

FOREIGN PATENT DOCUMENTS

WO9429849  12/1994  WIPO.

OTHER PUBLICATIONS

800 MHz Cellular System, TDMA Radio Interface, dual–Mode Mobile Station–Base Station Compatibilty Standard, TIA/EIA Standard, Jun. 7, 1996.

Primary Examiner—Reinhard J. Eisenzopf
Assistant Examiner—Charles N. Appiah
Attorney, Agent, or Firm—Sughrue, Mion, Zinn, Macpeak & Seas, PLLC

[57] ABSTRACT

A receiver of block coded speech signals receives signals transmitted by means of discontinuous transmission and estimates the acceptable or unacceptable nature of the blocks received. A volume control device commands reduction of the volume in the case of reception of unacceptable blocks. A detector, on the basis of the results of the estimate, determines if the signals received are signals transmitted using discontinuous transmission. The volume is restored in the case of such detection.

7 Claims, 2 Drawing Sheets

VOLUME CONTROL DEVICE FOR RECEIVER OF BLOCK CODED SPEECH SIGNALS

BACKGROUND OF THE INVENTION

1. Field of the invention

The present invention is generally concerned with digital systems for transmitting speech signals, in particular mobile radio systems, in which a bit rate reducing code is used by the transmitter and a corresponding decoder is used by the receiver.

The present invention is more particularly concerned with systems of this kind in which said bit rate reducing code is a so-called block code which, in the manner that is known in itself, extracts representative parameters of speech signals in time intervals of specified duration (typically 20 ms) during which the characteristics of the speech signals can be regarded as stable, and transmits these parameters, rather than the signals themselves, in the form of entities called blocks or speech frames.

The present invention is even more particularly concerned with systems of this kind in which the receiver estimates the acceptable or unacceptable nature of the blocks received, a received block being deemed to be unacceptable if its transmission quality (as determined at the receiver by methods known in themselves) is deemed to be insufficient, for example.

2. Description of the prior art

Document WO 94/29849 describes replacing blocks deemed to be unacceptable with blocks obtained by interpolation of these blocks with previous blocks deemed to be acceptable and simultaneously reducing the volume, the volume being reduced to zero after a certain time if the blocks continue to be unacceptable.

A particular aim of the present invention is to provide a volume control device for a receiver of block coded speech signals adapted to receive signals transmitted using the discontinuous transmission (DTX) technique.

A particular aim gf the present invention is to provide a volume control device for a receiver of block coded speech signals that can function equally well whether or not the discontinuous transmission technique is used to transmit to the receiver.

The discontinuous transmission technique is intended in particular to reduce the level of interference in a cellular system such as the GSM system, for example. In the absence of voice activity, no information is transmitted (this is equivalent to the transmission of "empty" blocks in the description that follows) apart from "comfort" noise intended to prevent the receiver deciding that communication has been cut off. The bit rate of this noise is very much lower than that of speech information.

In a mobile radio system such as the GSM system, for example, the blocks corresponding to the comfort noise are transmitted in particular frames called silence description (SID) frames within a multiframe structure, the other frames of the multiframe being "empty" blocks (the terms "frame" and "multiframe" refer here to a time-division multiplex structure used for transmission in a system of this kind).

For more information on the discontinuous transmission technique reference may be made to "The GSM System for Mobile Communications" by Michel MOULY and Marie-Bernadette PAUTET (ISBN 2-9507190-0-7).

The "empty" blocks corresponding to frames other than the SID frames are deemed to be unacceptable blocks and are replaced, by extrapolation, with the comfort noise conveyed in the preceding SID frames. However, a problem arises with a receiver of the above-mentioned type, i e. a receiver in which the volume is reduced, possibly to zero, in the event of unacceptable blocks, namely that listener comfort is not optimized because the reproduction of the comfort noise is not optimized.

The present invention avoids this drawback.

SUMMARY OF THE INVENTION

The present invention consists in a volume control device for a receiver of block coded speech signals adapted to receive signals transmitted by means of discontinuous transmission and including means for estimating the acceptable or unacceptable nature of the blocks received, the device including means for commanding reduction of the volume in the case of reception of unacceptable blocks, detector means for detecting, on the basis of the results of said estimate, if the signals received are signals transmitted using discontinuous transmission, and means for command restoring of the volume in the case of such detection.

Other objects and features of the present invention will emerge from a reading of the following description of one embodiment given with reference to the appended drawings.

DETAILED DESCRIPTION OF THE PREFERRED EMBODIMENT

Figure 1:
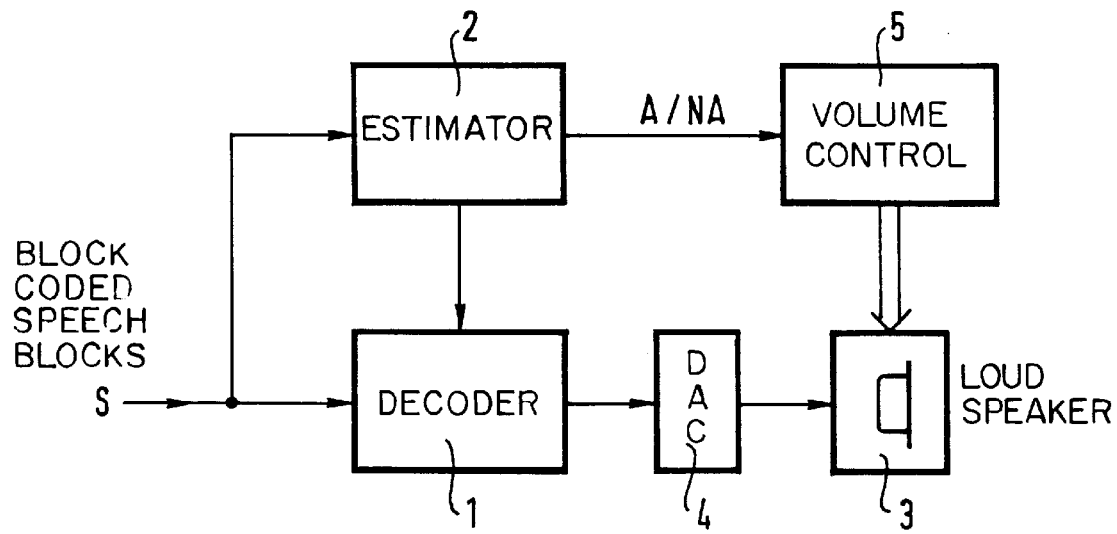
FIG. 1 is a block diagram of the various components of a receiver for block coded speech signals with which a volume control device of the invention cooperates.

FIG. 1 shows:

a decoder 1 receiving block coded speech blocks S, means 2 receiving the same coded speech blocks S. estimating whether these speech blocks are acceptable or unacceptable and commanding the execution in the decoder 1 of a process of interpolation or extrapolation of blocks in the case of blocks deemed to be unacceptable, a loudspeaker 3 receiving the signals from the decoder 1 via a digital-analog converter 4, a volume control device 5 for the loudspeaker 3 and also receiving, from the means 2, information A/NA as to the acceptable or unacceptable ("non-acceptable") nature of the blocks received.

Figure 2:
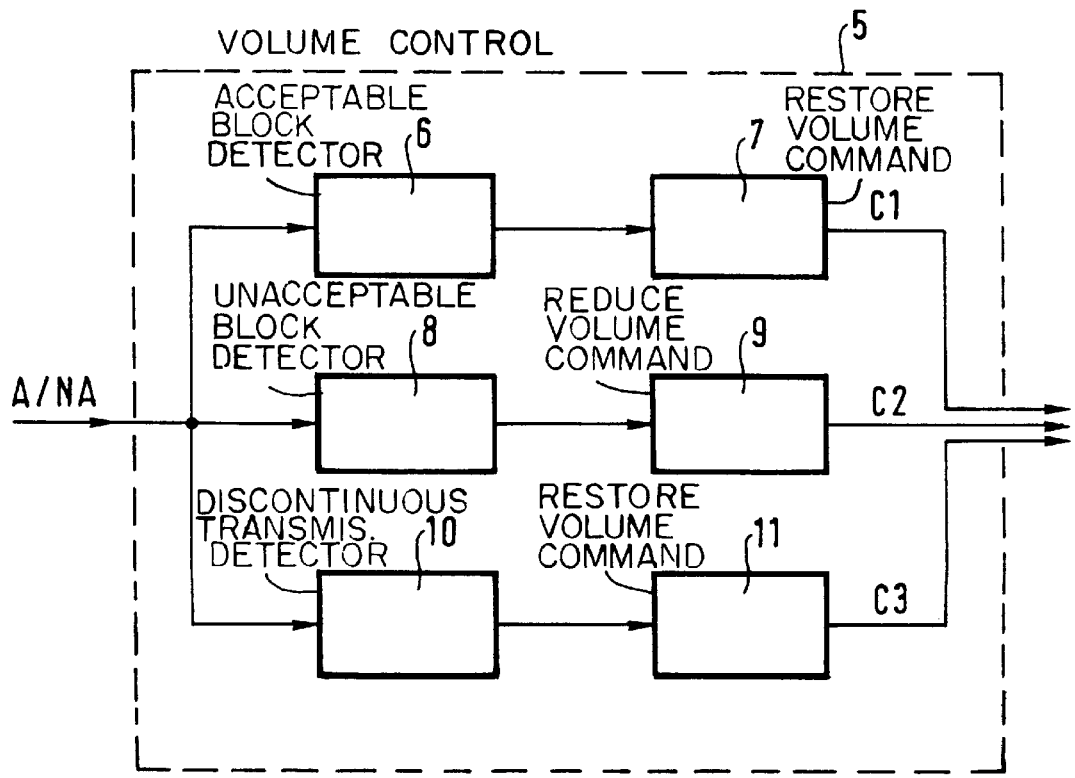
FIG. 2 is a general block diagram of one embodiment of the volume control device of the invention.

As shown in FIG. 2, a volume control device of the invention includes:

means 10 for detecting if the signals received are signals transmitted by discontinuous transmission, and means 11 for commanding restoring of the volume in the event of such detection (command C3).

In the example described, the control device 5 further includes:

means 8 for detecting a sequence of consecutive unacceptable blocks or a sequence of consecutive acceptable and unacceptable blocks in which unacceptable blocks predominate, the means 8 responding to detection of any such sequence by activating:

means 9 for commanding reduction of the volume (command C2).

In the example described the volume control device 5 further includes:

means 6 for detecting a sequence of consecutive acceptable blocks or a sequence of consecutive acceptable and unacceptable blocks in which acceptable blocks predominate, and means 7 for commanding restoring of the volume in the case of detection of any such sequence (command C1).

In the example described the sequence detector means 6 or 8 further include means (not specifically shown) for assigning a greater weight to unacceptable blocks The expression "restoring of the volumes" means either returning the volume to its normal level, if previously reduced, or maintaining the volume at its normal level it if has not been reduced beforehand (the normal value being, for example, the value selected by the user where the volume can be adjusted by the user).

Figure 3:
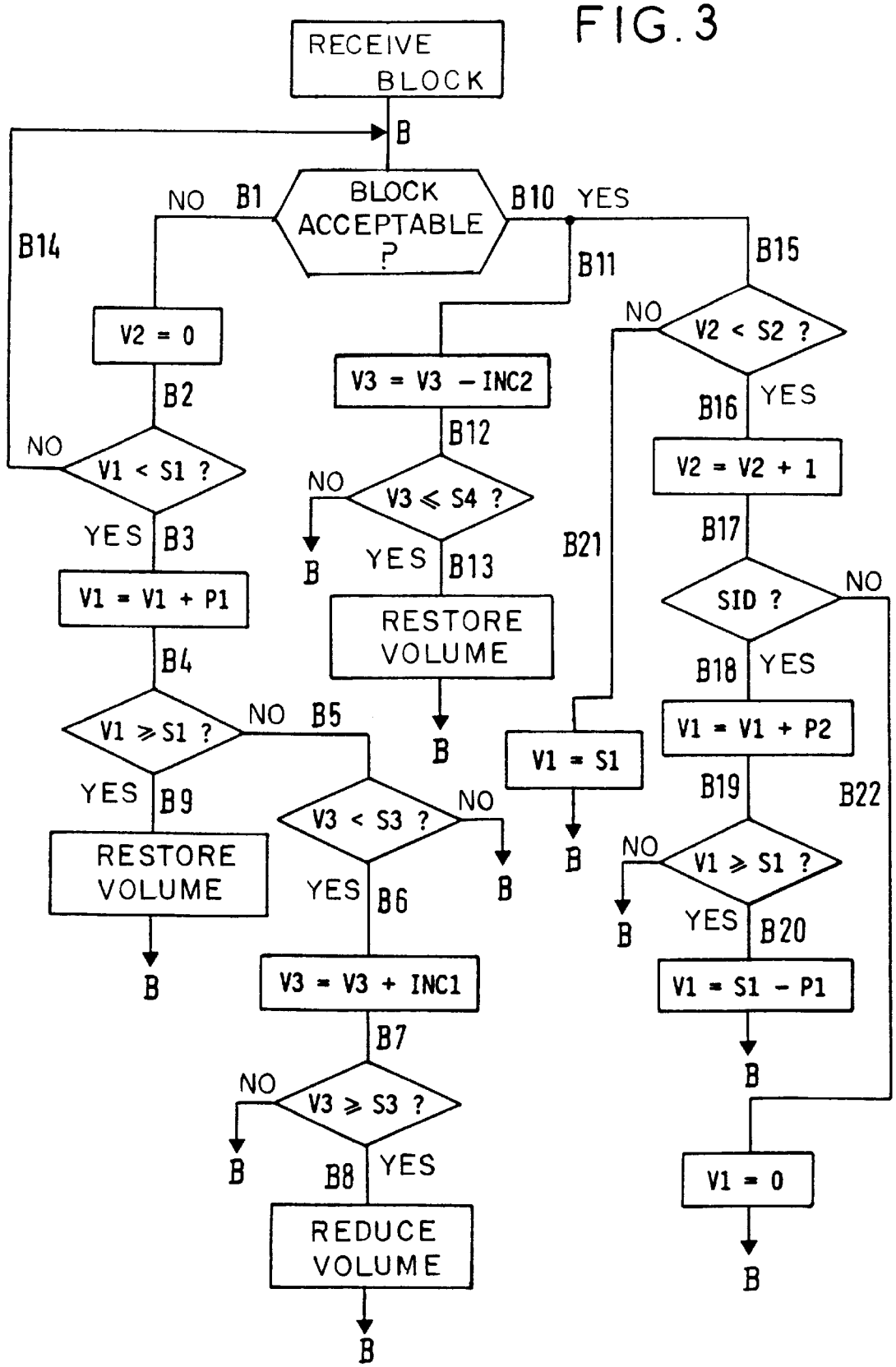
FIG. 3 is a flowchart of a typical algorithm of a volume control device as shown in FIG. 2.

The control device shown in FIG. 2 is implemented by means of a data processor executing the algorithm shown in FIG. 3, for example.

This algorithm uses the following variables:

V1: variable for detecting a sequence of consecutive unacceptable and acceptable blocks corresponding to a configuration used in discontinuous transmission, V2: variable for counting consecutive blocks received deemed to be acceptable, V3: variable for counting the number of acceptable or unacceptable blocks predominating in a sequence of consecutive received blocks.

This algorithm also uses the following parameters:

S1: threshold with which the variable V1 is compared to determine if discontinuous transmission is being used and therefore if it is appropriate to restore the volume, S2: threshold to which the variable V2 is compared, S3: threshold to which the variable V3 is compared to determine if it is appropriate to reduce the volume, S4: threshold with which the variable V3 is compared to determine if it is appropriate to restore the volume, INC1: value by which the variable V3 is incremented in the case of an unacceptable received block, INC2: value by which the variable V3 is incremented in the event of an acceptable received block, with INC2<INC1 in this example, in order to assign a greater weight to unacceptable blocks, P1: value by which the variable V1 is incremented in the event of an unacceptable received block, P2: value by which the variable V1 is incremented in the event of an acceptable block received at a location reserved for the transmission of comfort noise in the case of discontinuous transmission, with P2>P1 in this example.

In one non-limiting example corresponding to an application to the GSM system, the following values may be taken for the various parameters defined above:

S1=20, S2=16, S3=16, S4=0,

INC1=2, INC2=1,

P1=1, P2 =10

In accordance with this algorithm:

if the received block is an unacceptable block:
  the variable V2 is reinitialized and then it is determined if the variable V1 is below the threshold S1,
  if the variable V1 is below the threshold S1, the variable V1 is incremented by a value equal to P1 and it is determined if the variable V1 is above or equal to the threshold S1,
  if the variable V1 is above or equal to the threshold S1, it is deduced that discontinuous transmission is being used, and the volume is restored,
  if the variable V1 is below the threshold S1 it is determined whether the variable V3 is below the threshold S3,
    if the variable V3 is below the threshold S3 the variable V3 is incremented by a value equal to INC1 and it is determined if the variable V3 is above or equal to the threshold S3,
      if the variable V3 is above or equal to the threshold S3 the volume is reduced (possibly to zero if it has previously been reduced in this manner), if the received block is an acceptable block:
  it is determined if the variable V2 is below the threshold S2,
  if the variable V2 is not below the threshold S2 the variable V1 is reinitialized to the value S1, otherwise the variable V2 is incremented and it is then determined if the acceptable block received is at a location reserved, in the case of discontinuous transmission, for transmission of comfort noise, i.e. at the location of an "SID" frame in the GSM system, for example,
  if the acceptable block received is not at a location reserved, in the case of discontinuous transmission, for transmission of comfort noise, the variable V1 is reinitialized,
  if the acceptable block received is at a location reserved, in the case of discontinuous transmission, for transmission of comfort noise, the variable V1 is incremented by a value equal to P2 and it is then determined if the variable V1 is above or equal to the threshold S1,
    if the variable V1 is above or equal to the threshold S1 the variable V1 is reinitialized to the value S1–P1, further, if the block received is an acceptable block:
  the variable V3 is decremented by a value equal to INC2 and it is then determined if the variable V3 is below or equal to the threshold S4, and
  if the variable V3 is below or equal to the threshold S4 the volume is restored.

Thus:

in the case of a sequence of unacceptable blocks received consecutively, branches B1 through B7 of the algorithm (see FIG. 3) are executed in succession for each of the blocks and the branch B8 in which the volume is reduced is executed only if the number of consecutive unacceptable blocks exceeds a threshold (equal to S3 in this example), in the case of a sequence of acceptable blocks received consecutively the branches B10, B11, B12 of the algorithm are executed successively for each block and the branch B13 in which the volume is restored is executed if and only if the number of consecutive acceptable blocks exceeds a threshold (equal to S4 in this example), in the case of a sequence of consecutive received blocks including alternately acceptable blocks and unacceptable blocks, one of the sequences of branches defined above are executed one after the other and, according to the type (acceptable or unacceptable) of block that predominates in the sequence, if the number of blocks obtained exceeds the set threshold, either the volume is reduced or the volume is restored.

The use of discontinuous transmission can be detected by detecting a sequence of consecutive unacceptable and acceptable blocks corresponding to a configuration used in discontinuous transmission, in the following manner:

Assuming, for example, that the first block received in the discontinuous transmission is the "empty" block transmitted in the first frame of the multiframe structure used for the transmission:

- the branches B1, B2, B3, B4 of the algorithm are executed for each of the "empty" blocks received in the first location (or frames) of a first multiframe not reserved for transmission of comfort noise,
- the branches B10 and B15 through B20 of the algorithm are executed for the block received in the next location of the first multiframe reserved for the transmission of comfort noise (i.e. an "SID" frame in the case of the GSM system, for example),
- the branches B1, B2, B3, B4, B9 of the algorithm are executed in succession for the "empty" block received in the next location of the first multiframe not reserved for the transmission of comfort noise and the volume is thereby restored,
- the branches B1, B2, B14 of the algorithm are executed for each "empty" block received in the subsequent locations of the first multiframe not reserved for the transmission of comfort noise, in which case the volume is not changed,
- the branches B1, B2, B14 of the algorithm are executed for each "empty" block received in the locations of each subsequent multiframe not reserved for the transmission of comfort noise and the branches B15 through B20 of the algorithm are executed for the block received in the location of each subsequent multiframe reserved for the transmission of comfort noise, in which case the volume is not altered either.

In this embodiment, discontinuous transmission can also be detected by detecting the reception of unacceptable blocks after the reception of a sequence of a sufficient number of acceptable blocks. In such cases there is a strong presumption that discontinuous transmission is being used and the volume is therefore not reduced.

To achieve this, when the number of acceptable blocks in any such sequence exceeds a threshold (equal to S2 in this example) the branches B10 and B15 of the algorithm are executed, followed by the branch B21 in which the variable V1 is forced to the value S1.

For each unacceptable block received thereafter the branches B1, B2, B14 of the algorithm are executed with the result that there is no risk of the volume being reduced as would have occurred on execution of the subsequent branches B1 through B8 of the algorithm.

Note that in the embodiment described, enabling operation either in the presence or the absence of discontinuous transmission, it is not possible to command a reduction of volume on reception of a single unacceptable block. Note, however, that if it is known in advance that discontinuous transmission is not being used, either at present or at all, it is possible to opt to reduce the volume on reception of a single unacceptable block.

In the above examples the volume is not restored on reception of a single acceptable block, but only on reception of a sequence of consecutive acceptable blocks or of a sequence of consecutive acceptable and unacceptable blocks in which acceptable blocks predominate, which again improves listener comfort.

There is claimed:

1. A volume control device for a receiver of block coded speech signals adapted to receive signals transmitted by means of discontinuous transmission and including means for estimating the acceptable and unacceptable nature of the blocks received, the device including means for commanding reduction of volume of a sound reproducing device at said receiver in the case of reception of unacceptable blocks, detector means for detecting, on the basis of an output of said means for estimating, if the signals received are signals transmitted using discontinuous transmission, and means for commanding restoring of the volume in the case of such detection.

2. The device claimed in claim 1 wherein said detector means include means for detecting a sequence of consecutive unacceptable and acceptable blocks corresponding to a configuration used in discontinuous transmission.

3. The device claimed in claim 1 wherein said detector means include means for detecting the reception of unacceptable blocks after the reception of a sequence of a sufficient number of acceptable blocks.

4. A volume control device for a receiver of block coded speech signals adapted to receive signals transmitted by means of discontinuous transmission and including means for estimating the acceptable and unacceptable nature of the blocks received the device including:

- means for commanding reduction of volume in the case of reception of unacceptable blocks,
- detector means for detecting, on the basis of an output of said means for estimating, if the signals received are signals transmitted using discontinuous transmission,
- means for command restoring of the volume in the case of such detection, and
- means for detecting a sequence of consecutive unacceptable blocks or a sequence of consecutive acceptable blocks and unacceptable blocks in which unacceptable blocks predominate and wherein said means for commanding reduction of the volume are activated in the event of detection of any such sequence.

5. The device as claimed in claim 4 wherein said sequence detector means include means for assigning a greater weight to unacceptable blocks.

6. A volume control device for a receiver of block coded speech signals adapted to receive signals transmitted by means of discontinuous transmission and including means for estimating the acceptable and unacceptable nature of the blocks received, the device including:

- means for commanding reduction of volume in the case of reception of unable blocks,
- detector means for detecting on the basis of an output of said means for estimating, if the signals received are signals transmitted using discontinuous transmission,
- means for command restoring of the volume in the case of such detection,
- means for detecting a sequence of consecutive acceptable blocks or a sequence of consecutive acceptable and unacceptable blocks in which acceptable blocks predominate, and
- means for commanding restoring of the volume in the event of detection of any such sequence.

7. The device as claimed in claim 6 wherein said sequence detector means include means for assigning a greater weight to unacceptable blocks.

* * * * *